United States Patent [19]
Huanga et al.

[11] Patent Number: 5,670,431
[45] Date of Patent: Sep. 23, 1997

[54] METHOD OF FORMING AN ULTRA THIN DIELECTRIC FILM FOR A CAPACITOR

[75] Inventors: Julie Huanga; Mong-Song Liang, both of Hsin-Chu, Taiwan

[73] Assignee: Taiwan Semiconductor Manufacturing Company Ltd., Hsin-Chu, Taiwan

[21] Appl. No.: 663,430

[22] Filed: Jun. 13, 1996

[51] Int. Cl.$^6$ .................................................. H01L 21/02
[52] U.S. Cl. .............................. 437/241; 437/52; 437/47; 437/60; 437/919
[58] Field of Search .................................. 437/52, 47, 60, 437/919, 241, 978

[56] References Cited

U.S. PATENT DOCUMENTS

| | | | |
|---|---|---|---|
| 5,104,819 | 4/1992 | Freiberger et al. | 437/978 |
| 5,378,645 | 1/1995 | Inoue et al. | 437/60 |
| 5,380,399 | 1/1995 | Miyashita et al. | 156/646 |
| 5,423,944 | 6/1995 | Wong | 156/646.1 |
| 5,492,854 | 2/1996 | Ando | 437/52 |

*Primary Examiner*—Trung Dang
*Attorney, Agent, or Firm*—George O. Saile; William J. Stoffel

[57] ABSTRACT

The present invention provides a method of forming a ultra thin silicon nitride/silicon oxide (NO) dielectric layer over a polysilicon capacitor electrode formed adjacent to a silicon oxide insulating layer. First, a HF in-situ vapor clean is used to clean the polysilicon electrode and oxide insulating layers. A first silicon nitride (SiN) layer is then selectively deposited over the electrode. Next, the substrate is exposed to air. This grows a native oxide layer over the first silicon nitride layer and the insulating layer. Next, a second SiN layer is formed over the first silicon nitride layer, the insulating layer and the interface between the polysilicon electrode and the insulating layer. A thin oxide dielectric layer is grown over the second silicon nitride layer to complete the (NO) capacitor dielectric layer. The method of the present invention is an inexpensive process that provides an oxide free interface between the polysilicon and oxide layers. The method produces an uniform ultra thin silicon nitride/silicon oxide dielectric layer over a polysilicon electrode.

20 Claims, 5 Drawing Sheets

METHOD OF FORMING AN ULTRA THIN DIELECTRIC FILM FOR A CAPACITOR

BACKGROUND OF INVENTION

1) Field of the Invention

The present invention relates generally to the fabrication of capacitors and particularly to a method for fabricating a high quality ultra thin dielectric layer for a DRAM stacked capacitor and more particularly to a method for fabricating a high quality ultra thin silicon nitride/silicon oxide (NO) dielectric layer.

2) Description of the Prior Art

The semiconductor industry has always followed the development of the Dynamic Random Access Memory (DRAM) technology because DRAM development has led in the use of the highest density technology elements capable of being produced in manufacturable quantities. The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of memory cell as well as consumes excessive power during low-voltage operation by impeding device operation.

As the size of the DRAM cell has been reduced, the minimum amount of stored charge need to maintain reliable memory operation has remained the same. The required constant charge-storage value has to be maintained within manufacturing cost constraints. The cell's storage capacity can be increased by (a) making the capacitor dielectric thinner, (b) by using an insulator with a large dielectric constant, or (c) by increasing the area of the capacitor. The following equation show the relationship between storage charge ($Q_s$ in coulombs) and capacitor parameters: ($C_s$=Capacitance, $\epsilon$=capacitor dielectric constant, A=area of the capacitor, $V_g$=voltage applied to the gate, $T_{dielectric}$=thickness of the capacitor dielectric layer):

$$Q_s = V_g C_s = (\epsilon \times A \times V_g)/T_{dielectric}$$

As can be seen by the above equation, to maintain the total Charge ($Q_s$) while decreasing the Area (A), the dielectric constant ($\epsilon$) should be increased or the thickness of the capacitor dielectric layer $T_{dielectric}$ should be decreased.

Since the density of each new generation of DRAM must increase by about fourfold that means that the area of the capacitor will be significantly decreasing. New capacitor designs, such as multi-plate and stacked capacitors, have increased the capacitor area related to the cell area, but even more capacitance is required. Therefore, this invention focuses on increasing the capacitor dielectric constant ($\epsilon$) and decreasing the $T_{dielectric}$ while maintaining film integrity.

To increase the dielectric constant, silicon nitride is used as part of the capacitor dielectric since the dielectric constant of silicon nitride is has about twice as large as the dielectric constant ($\epsilon$) for silicon oxide. Also, dielectric films must have a uniform thickness and be defect and pinhole free. To decrease the film thickness, processes must be developed that provide films with more integrity. Dielectric films must have a uniform thickness and be defect and pinhole free. This is especially important near corners and seams where the electrode joins with adjacent insulating layers.

Figure 7:
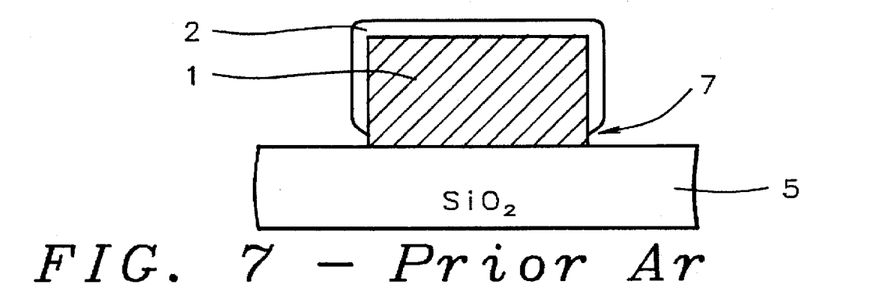
FIGS. 7 and 8 are cross sectional views for illustrating conventional processes for forming capacitor dielectric layers.
Figure 8:
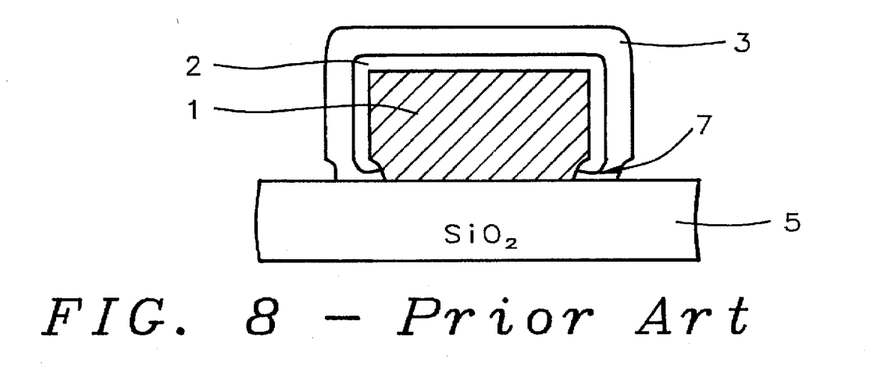

A conventional process for forming a stacked capacitor using a nitride/oxide (NO) dielectric layer consists of forming a polysilicon electrode 1 at least partially over a silicon oxide insulating layer 5. See FIGS. 7 and 8. Next, a silicon nitride layer 2 is formed over the polysilicon electrode 1. The silicon nitride deposits on the polysilicon electrode 1. However, a gap forms where the silicon nitride does not cover the electrode-silicon nitride joint 7 as shown in FIG. 7. Next, a thin silicon oxide dielectric layer 3 is grown over the silicon nitride layer 2 to form a nitride/oxide (NO) dielectric layer. However the oxide layer 3 grows directly on the electrode 1 at the nitride-electrode joint 7. The oxide in the gap lowers the overall dielectric constant ($\epsilon$) NO of the layer because the dielectric constant ($\epsilon$) of oxide is about half that of nitride. Moreover, the NO dielectric layer has been found to have high leakage problems and low reliability. This indicates that the layer is not uniform and pinhole free.

Workers in the field have tried to solve different problems. For example, U.S. Pat. No. 5,423,944 (Wong) teaches a method for etching a silicon wafer by using HF and water vapor combined with ozone. U.S. Pat. No. 5,380,399 (Miyashita et al.) teaches of method of preventing oxide from growing on a substrate surface by heating the wafer and introducing an etching gas (HF) into the heating chamber.

SUMMARY OF THE INVENTION

It is an object of the present invention to provide a novel method for fabricating a stacked capacitor having an ultra thin dielectric layer composed of silicon nitride and silicon oxide which ensures high reliability, high film integrity, low leakage current and large cell capacitance.

It is another object of the present invention to provide a novel method for fabricating a thin dielectric layer composed of silicon nitride (SiN) and silicon oxide that covers the seam between a polysilicon layer (e.g., electrode) and an adjacent insulation layer.

To accomplish the above objectives, the present invention provides a method of forming a nitride/oxide (NO) dielectric layer over a polysilicon electrode where the electrode is formed adjacent to a silicon oxide insulating layer. The invention provides a five step process comprising: (1) an initial HF clean (2) a first SiN layer selective deposition over the electrode, (3) a vacuum break (the wafer is exposed to air) to grow a native oxide, (4) a second SiN layer deposition, and (5) a silicon oxide dielectric layer growth over the second SiN layer to form the ultra thin NO dielectric layer of the present invention. First, a HF insitu vapor clean is used to clean the polysilicon electrode and adjacent oxide insulation layers. Second, a first SiN layer is selectively deposited over the polysilicon electrode, but is not deposited on the insulating layer (e.g., silicon oxide) which is adjacent to the electrode. Next, the substrate is exposed to atmospheric pressure air at a high temperature of about 700° C. This grows a native oxide layer over the silicon nitride layer. Also this grows a native oxide layer on the silicon oxide insulating layer which is adjacent to the electrode. Next, a second SiN layer is formed over the native oxide layer including the first silicon nitride layer, the insulating layer, and the interface between the polysilicon electrode and the insulating layer. Fifth, an oxide dielectric layer is grown over the second silicon nitride layer to form the NO layer of the present invention.

In slightly more detail, the method of forming an ultra thin (NO) dielectric film for a capacitor on a semiconductor substrate provides a substrate having two spaced gate structures with a source region therebetween. The gate structures have top oxide surfaces and sidewall spacers. A first oxide layer overlies portions of the top oxide surface. A bottom electrode composed of polysilicon is formed overlying portions of the first oxide layer, the top oxide surfaces of the gates and the source region. The method begins by: under a non-oxidizing environment, cleaning the surfaces of the bottom electrode with a HF vapor; under a non-oxidizing environment, forming a first silicon nitride layer over the bottom electrode; the first silicon nitride layer formed using dichlorosilane and ammonia at a pressure in a range between about 6 and 7 torr and at a temperature in a range between about 650° and 800° C.; and the first silicon nitride layer having a thickness in a range between about 10 and 20 Å; subjecting the semiconductor substrate to air thereby growing a native oxide over the first oxide layer; forming a second silicon nitride layer over the first silicon nitride layer and the native oxide layer; and growing a silicon oxide dielectric layer over the second silicon nitride layer.

During steps (a) and (b) the wafers are kept preferably at a reduced pressure (below 760 torrs) in an non-oxidizing gas environment, such as $N_2$ or Ar.

The method of the present invention is an inexpensive process that provides an uniform integrate silicon nitride dielectric layer over a polysilicon layer (e.g., electrode). The invention has two key steps. First, the vapor HF cleaning in step(a) allows the first silicon nitride layer to completely form over the electrode and interface 31 and therefore provides an oxide-free interface between the first silicon nitride layer and the bottom electrode. This prevents the gap problem 7 of the prior art shown in FIGS. 7 and 8. The second key step is the vacuum break that grows a native oxide over the first silicon nitride layer and the adjacent insulating layer. This ensures that the second nitride layer will cover completely the first nitride layer and the adjacent oxide layer.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Now in keeping with the objectives of this invention, the method for fabricating a stacked capacitor having an ultra thin silicon nitride dielectric layer (e.g., N, NO, NONO) which ensures high reliability and low leakage current is given. The sequence of steps for forming the dielectric layer composed of silicon nitride and silicon oxide (NO) is shown in FIGS. 1–4 and a flow chart which overviews the process is shown in FIG. 5. The general fabrication steps for forming a capacitor and a DRAM FET are given along with the detailed steps of forming the thin NO dielectric layer. Throughout this description, a "dielectric layer" is a part of the capacitor dielectric layer between the top and bottom electrode plates. An "insulating layer" is a layer between conductive lines/structures.

Figure 1:
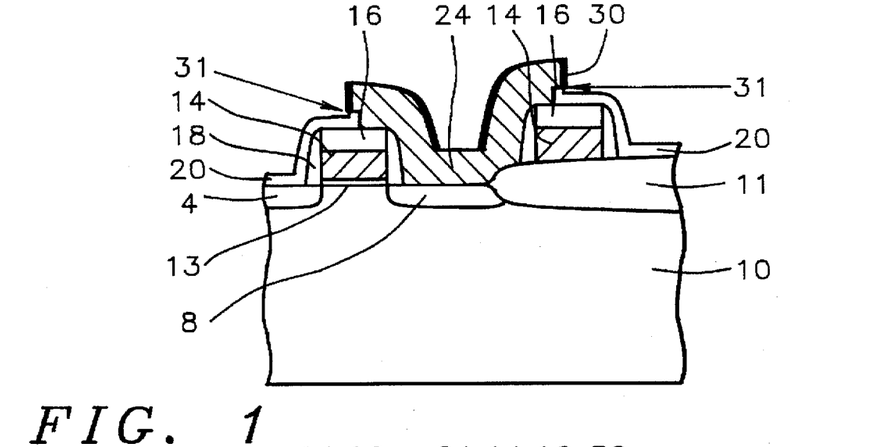
FIGS. 1 through 4 are cross sectional views for illustrating a first embodiment for a method for manufacturing a high quality ultra thin silicon nitride/silicon oxide (NO) dielectric layer for capacitor according to the present invention.

Referring now to FIG. 1, a semiconductor substrate 10 is provided having two spaced gate structures 13 14 16 18 with a source region 8 therebetween. The preferred substrate 10 is composed of a P-type single crystal silicon having a (100) crystallographic orientation. The gate structures preferably have top oxide surfaces 16 and sidewall spacers 18. A first oxide (insulating) layer 20 overlies portions of the top oxide surface 16. The substrate, gate structures, and field oxide 11 can be formed by conventional semiconductor methods. For example, field oxide layer 11 is formed on a semiconductor substrate 10 for defining active regions and isolation regions. A relatively thick field oxide (FOX) 11 is formed around the active device areas to electrically isolate these areas. This field oxide is formed by masking the active device areas with a thick silicon oxide (pad oxide) and a thicker silicon nitride layer which forms an oxidation barrier. The silicon substrate is then oxidized in an oxidizing ambient to form the field oxide. The preferred thickness is in a range of about 4000 to 6000 Å.

The semiconductor FET device is then formed in the active device area after removing the silicon nitride barrier layer and the pad oxide in a convention wet etch. This device is formed by first thermally oxidizing the active device area to form a thin gate oxide 13. The preferred thickness is from about 90 to 200 Å.

An appropriately doped polysilicon layer, a tungsten silicide layer, and an insulating layer are preferably deposited on substrate 10 and conventional photolithographic-etching techniques are used to pattern the polysilicon layer 14, tungsten silicide layer 14, and the insulating layer 16. This patterning forms the gate electrode 13 14 16 of the MOSFET in the active device areas and conductive patterns elsewhere on the substrate. The conductive patterns 14 formed on the field oxide 11 can form the word lines that electrically connect the MOSFET gate electrode to the appropriate peripheral circuits on the DRAM chip.

The source/drain regions 8 of the MOSFET are formed next, usually by implanting an N-type atomic species, such as arsenic or phosphorus through the spaces between the gate electrodes 14 18. For example, a typical implant might consist of phosphorus P31 at a dose of between about 1E13 and 1E14 atoms/cm$^2$ and at an energy between about 30 and 80 Kev.

After forming the source/drain regions 8, sidewall spacers 18 are preferably formed on the gate electrode sidewalls. These sidewall spacers 18 are preferably formed by depositing a low temperature silicon oxide and anisotropically etching back to the silicon surface. For example, the silicon oxide could be formed using a chemical vapor deposition with tetraethoxysilane (TEOS) at a temperature in a range of about 650° to 900° C. and the etch back performed in a low pressure reactive ion etcher.

The gate structure can include a first insulation layer 20 is formed over the substrate surface. The first insulation layer is preferably formed of silicon oxide, silicon nitride, borophosilicate glass (BPSG), or TEOS and is more preferably formed of silicon oxide. A first insulation layer 20 preferably composed of silicon oxide can be formed by a conventional process, such as a chemical vapor deposition (CVD) or a LPCVD process. The first insulating layer 20 is preferably formed by a CVD process using tetraethylorthosilicate (TEOS).

A contact hole is formed in the first insulation layer 20 to expose portions of the source 8, the sidewall spacers 18, and top oxide layer 16.

Next, a bottom electrode 24 is formed overlying portions of the first oxide layer, the top surface of the gate 16 and the source region 8. A conductive layer is formed over the substrate surface and patterned. The bottom electrode 24 is preferably composed of polysilicon or a two film structure of polysilicon and a metal silicide such as tungsten silicide. The bottom electrode 24 can be formed by any conventional process. For example, a polysilicon layer 24 can be formed by LPCVD (low pressure chemical vapor deposition). This layer is preferably doped by ion implanting with phosphorous or arsenic ions at a dosage between about 5E15 and 2E16 atoms/sq-cm and an energy of between about 20 and 60 Kev, or is doped with phosphorus oxychloride (POCl$_3$) at a temperature of between about 875° and 900° C., for between about 30 and 50 minutes. The bottom electrode 24 preferably has an impurity concentration in a range of between about 1E19 and 1E20 atoms/cm$^3$.

The process of forming the thin NO dielectric layer requires that during several of the next steps the wafer be kept in a non-oxidizing environment in order to prevent the growth of native oxide on the device surfaces. This non-oxidizing environment is important for the following steps: (1) HF clean and (2) the first SiN layer deposition. A non-oxidizing environment is preferably a reduced pressure between 1E-03 and 1E-09 torr and in a (non-oxygen containing) relatively inert gas, such as N$_2$ or Ar.

The process for forming the ultra thin NO dielectric layer begins by cleaning the surfaces of the bottom electrode 24 with a HF vapor. The HF clean has the important purpose of removing native oxide from the polysilicon bottom electrode 24 and the insulating layer 20. The HF clean has the effect of increasing the SiN deposition rate on silicon surfaces and decreasing the SiN deposition rate on SiO$_2$ surfaces. (See FIG. 9.) This difference in SiN deposition rates allows the subsequent first silicon nitride layer 30 to selectively deposit on the polysilicon electrode 24 and the interface 31, but not on the insulating layer 20. The HF clean can remove from 400 to 700 Å of an insulating layer 20 composed of silicon oxide. The HF clean step is preferably timed.

Figure 9:
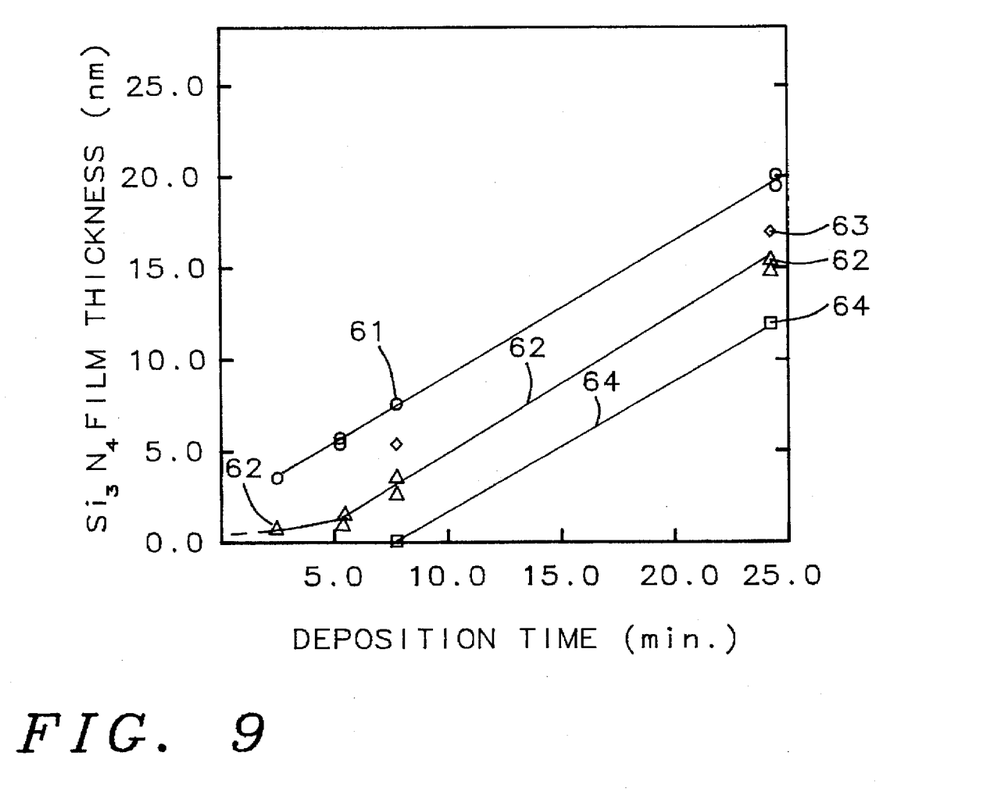
FIG. 9 is a graph showing the relationship between nitride thickness and deposition time for the processes of the current invention.

FIG. 9 shows the relationship between the silicon nitride (SiN) deposition times over silicon and silicon oxide surfaces, with and without a HF pre-clean. The conditions for the silicon nitride deposition were 750° C., 0.1 torr and using SiH$_2$Cl$_2$ and NH$_3$ reactants. Curve 61 shows the times of depositing SiN over a silicon surface with a HF pre-clean. Curve 62 shows the times for SiN deposition over a silicon surface without HF cleaning. Curve 63 shows the times for SiN deposition over a SiO$_2$ surface without HF cleaning. Curve 64 shows the times for SiN deposition over a SiO$_2$ surface with HF cleaning. Curves 62 and 63 overlay each other. As the curves 62 63 show, silicon and SiO$_2$ surfaces without HF pre-clean have about the same SiN deposition rates. Moreover, a silicon surface with a HF pre-clean (curve 61) has a much higher SiN deposition rate than a SiO$_2$ surface with a HF pre-clean (curve 64).

Figure 6:
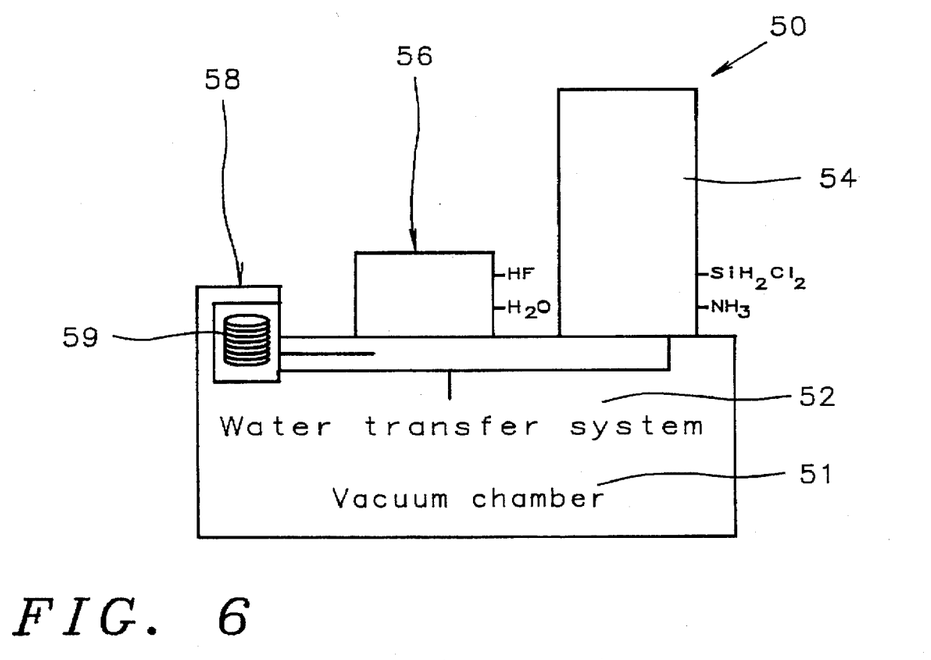
FIG. 6 is a schematic view of an insitu HF vapor cleaning and LPCVD furnace tool which can be used to implement the method for manufacturing a high quality ultra thin silicon nitride/silicon oxide dielectric layer for a capacitor according to the present invention.

The HF cleaning is preferably performed in-situ in a HF vapor cleaning and LPCVD tool like the one schematically shown in FIG. 6.

Still referring to FIG. 1, while the substrate remains under a non-oxidizing environment, a first silicon nitride layer 30 is selectively formed over the bottom electrode 24 and interface 31 between the electrode and the first insulating layer. The prior HF clean enables this selective first nitride deposition. The first silicon nitride layer 30 is preferably formed using dichlorosilane and hydrogen reactants at a pressure in a range between about 30 and 80 Pa and more preferably about 30 Pa; and at a temperature in a range between about 600° and 800° C. and more preferably about 600° C. The first silicon nitride layer 30 preferably has a thickness in a range between about 15 and 30 Å and more preferably about 20 Å.

Figure 2:
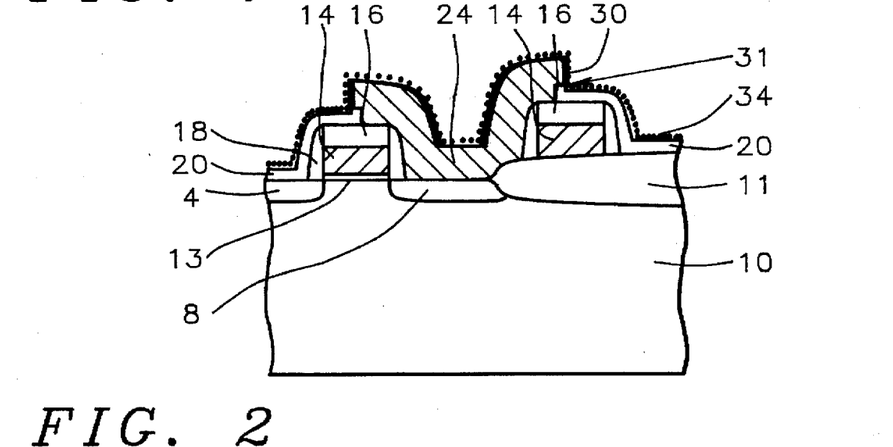

Referring to FIG. 2, the semiconductor substrate is subjected to air (or an oxygen containing gas mixture) thereby growing a native oxide layer 34 over the first oxide layer 20. The wafers can be at a temperature in a range of between about 300° and 650° C. and the air temperature can be room temperature and atmospheric pressure. This native oxide acts to increase the nucleation site density on the insulating layer surfaces (e.g., SiO$_2$). This vacuum break allows a subsequent second nitride layer 36 to form over both the first nitride layer (and the joint 31) and the first insulating layer 20. After the pressure break, the wafer are returned to a low pressure in an inert gas environment. The native oxide 34 preferably has a thickness in a range of between about 5 and 10 Å.

Figure 3:
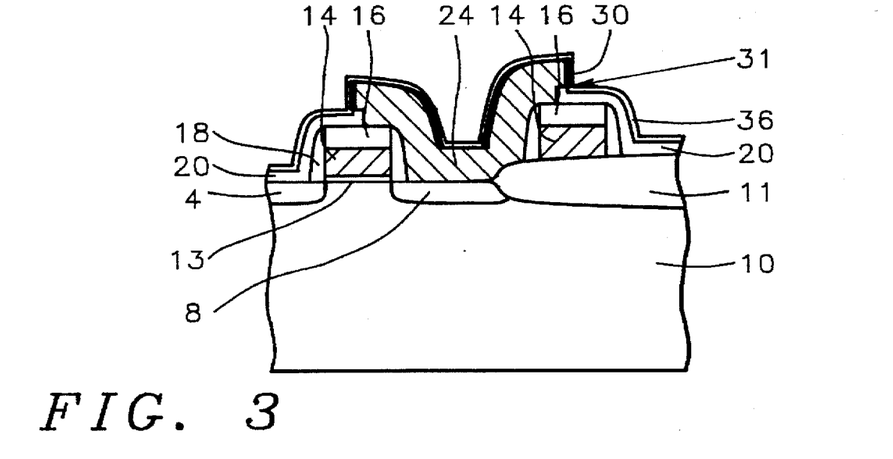

Referring to FIG. 3, a second silicon nitride layer 36 is formed over the native oxide layer 34 including over the first silicon nitride layer 30 and the insulating layer. The second silicon nitride layer is preferably formed using a LPCVD process with dichlorosilane and ammonia at reduced pressure. The second silicon nitride layer 36 is preferably formed using a process similar to that used to form the first silicon nitride layer 30. The second silicon nitride layer 36 preferably has a thickness in a range between about 30 and 40 Å and more preferably about 35 Å.

Figure 4:
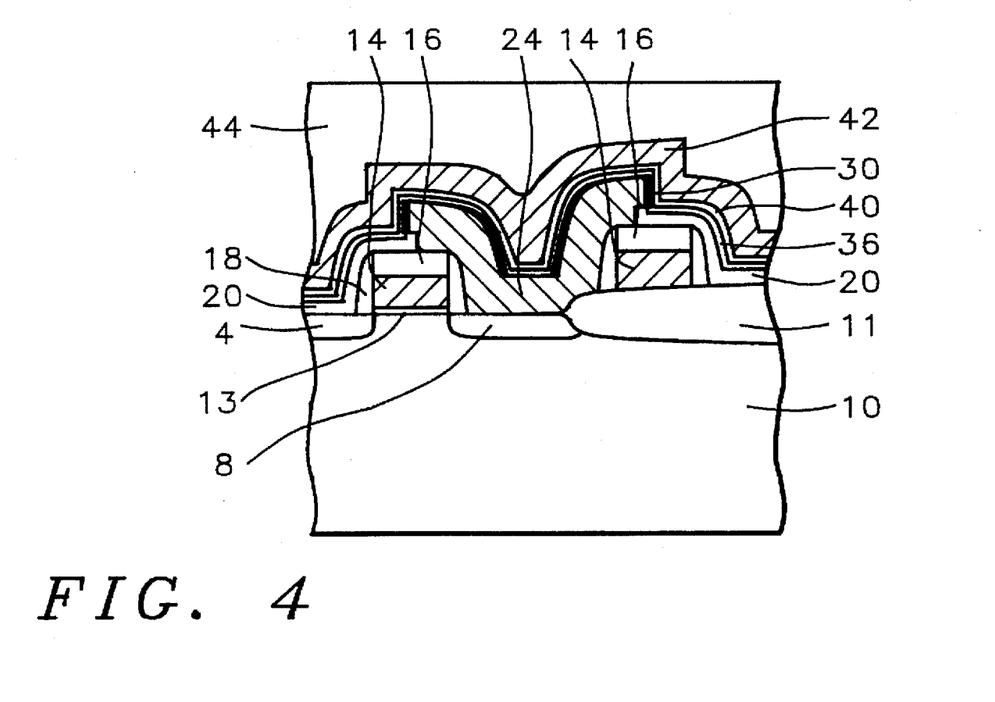
Figure 5:
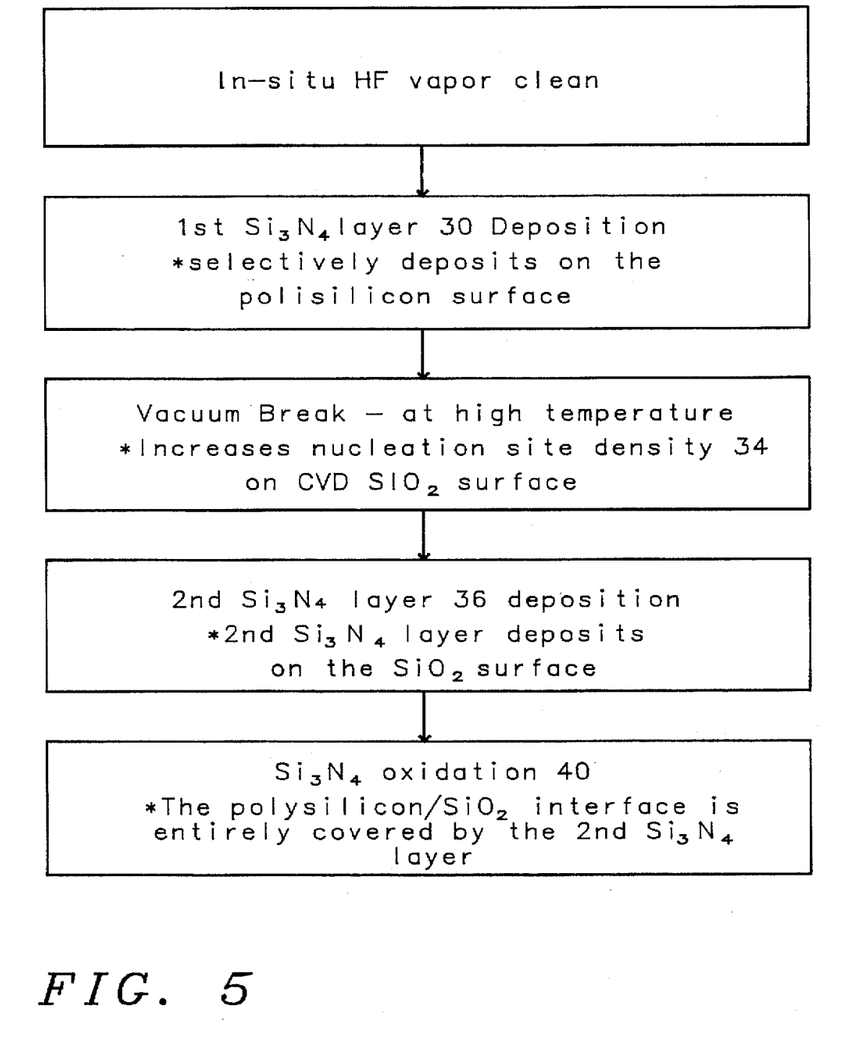
FIG. 5 is a flow chart for illustrating an embodiment of the method for manufacturing a high quality ultra thin silicon nitride/silicon oxide dielectric layer for a capacitor according to the present invention.

As shown in FIG. 4, a silicon oxide dielectric layer 40 is formed over the second silicon nitride layer 36 thus forming the ultra thin integrate dielectric film 30 36 40 of the invention. The second silicon oxide dielectric layer 40 is preferably formed using a wet oxidation at a temperature in a range of between about 800° and 900° C. and more preferably about 850° C. The second silicon oxide layer preferably has a thickness in a range between 30 and 40 and more preferably about 35 Å. The preferably method of forming the silicon oxide dielectric layer 40 is a thermal oxidation followed by an anneal preferably at between about 800° and 900° C. The anneal reduces the pin-hole density of the oxide layer 40.

The dielectric layer 30 36 40 described above has a nitride/oxide (NO) configuration. Other configurations of the dielectric layer of the invention are possible, such as only a silicon nitride layer (N), and NONO structure.

A top electrode 42 is then formed over the silicon oxide layer 40 as shown in FIG. 4. The top electrode is preferably formed of polysilicon.

Next, an insulation layer 44 is formed over the silicon oxide layer 40. The insulation layer 44 can be formed of a dope silicon oxide, such as BPSG.

In FIG. 6, the in-situ HF vapor cleaning tool and LPCVD furnace tool 50 is shown. This tool 50 can effect the method of the current invention. By this tool, an ultra thin NO dielectric layer can be formed over polysilicon and silicon oxide layers under reduced pressure and in a non-oxidizing environment for all the required steps. (i.e., HF clean and first SiN deposition).

As shown in FIG. 6, the HF vapor cleaning tool and LPCVD furnace tool 50 comprises: a vacuum chamber 51, a wafer transfer system 52, a LPCVD furnace system 54, a HF vapor cleaning system 56, a wafer loading/unloading station 58, and gas supplies, such as HF, $H_2O$, $SiH_2Cl_2$, and $NH_3$. A plurality of semiconductor wafers 59 is positioned in the wafer loading station 58 were the wafer transfer system carries the wafers between the HF cleaning station 56 and the LPCVD furnace 54. The wafer transfer system, the interfaces to the vapor cleaning system 56, and the LPCVD furnace 54 are maintained at a low pressure by the vacuum chamber 51.

The process of the invention is performed by etching the wafers in the cleaning station 56, transporting the wafers to the LPCVD furnace 54, and forming the first silicon nitride layer. The wafers are then subjected to the atmospheric environment to grow the native oxide layer. Next, the second silicon nitride layer is deposited on the wafers in the LPCVD furnace. The above steps are preferably performed in situ. The wafers are unloaded from the tool and loaded into another oxidation furnace where the oxide layer 40 is grown.

The method of the present invention is an inexpensive process that provides an integrate uniform silicon nitride/silicon oxide dielectric layer over a polysilicon layer. The invention prevents the problem formation of silicon oxide at the interface 31 between the polysilicon bottom electrode 24 and the adjacent insulating layer 20 as discussed above and shown in FIGS. 7 and 8.

It should be noted that the process for forming the gate structures and other devices can be varied as the process technology changes. The invention is applicable to form a thin Silicon nitride/silicon oxide dielectric layer over any polysilicon surface.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an uniform thin silicon nitride layer over a polysilicon layer and over an adjacent insulating layer, said polysilicon layer and said insulating layer join at an interface, the method comprises the steps of:
   a) under a non-oxidizing environment, cleaning the surface of said polysilicon layer with an HF vapor;
   b) under a non-oxidizing environment, selectively forming a first silicon nitride layer over said polysilicon layer and said interface;
   c) subjecting the semiconductor substrate to air thereby growing a native oxide over the said insulating layer and said first silicon nitride layer;
   d) under a reduced pressure, forming a second silicon nitride layer over said first silicon nitride layer and said native oxide layer, said second nitride layer completely covering said interface between said polysilicon layer and said insulating layer.

2. The method of claim 1 wherein said insulating layer is formed of silicon oxide.

3. The method of claim 1 wherein the non-oxidizing environment in steps (a) and (b) comprises a non-oxygen containing gas mixture at a pressure below 760 torrs.

4. The method of claim 1 which further includes growing a silicon oxide dielectric layer over said second silicon nitride layer thereby forming a silicon nitride/silicon oxide (NO) dielectric layer.

5. The method of claim 1 which further includes growing a silicon oxide dielectric layer over said second silicon nitride layer, said silicon oxide dielectric layer formed by a wet oxidation with a temperature in a range between 800° and 850° C.

6. The method of claim 1 wherein said insulating layer is formed by a chemical vapor deposition (CVD) process using tetraethylorthosilicate (TEOS).

7. The method of claim 1 wherein said polysilicon layer has a thickness in a range of between about 2000 and 5000 Å and an impurity concentration in a range of between about 1E19 and 1E20 atoms/$cm^3$.

8. The method of claim 1 wherein said polysilicon layer has an impurity concentration in a range of between about 5E16 and 2E16 atoms/$cm^3$.

9. The method of claim 1 wherein said first silicon nitride layer is formed using a LPCVD process with dichlorosilane and ammonia at reduced pressure at reduced pressure, said first silicon nitride layer formed at a pressure in a range between about 30 and 80 Pa, and at a temperature in a range between about 600° and 800° C. and said first silicon nitride layer having a thickness in a range between about 15 and 30 Å.

10. The method of claim 1 wherein said second silicon nitride layer is formed using a low pressure chemical vapor deposition (LPCVD) process with dichlorosilane and ammonia at reduced pressure, said second silicon nitride layer formed at a pressure in a range between about 30 and 80 Pa, and at a temperature in a range between about 600° and 800° C. and said second silicon nitride layer having a thickness in a range between about 30 and 40 Å.

11. The method of claim 1 wherein the method is performed in-situ in a HF cleaning and LPCVD furnace tool having a wafer transportation system.

12. A method of forming an ultra thin dielectric film for a capacitor on a semiconductor substrate, said substrate having two spaced gates structures with a source region therebetween, an insulating layer overlying portions of said gate structures, and said substrate having a bottom electrode comprised of polysilicon overlying portions of said insulating layer, said gate structures and said source region, the method comprising:
   a) cleaning the surfaces of said bottom electrode with a HF vapor;
   b) selectively forming a first silicon nitride layer over said bottom electrode;
   c) subjecting the semiconductor substrate to air thereby growing a native oxide over the said insulating layer and said first silicon nitride layer; and
   d) forming a second silicon nitride layer over said native oxide layer.

13. The method of claim 12 wherein said insulating layer is formed of silicon oxide.

14. The method of claim 12 which further includes forming a silicon oxide dielectric layer over said second silicon nitride layer.

15. The method of claim 12 which further includes forming a silicon oxide dielectric layer over the second silicon nitride layer and forming a top electrode layer over said silicon oxide dielectric layer thereby forming a capacitor.

16. The method of claim 12 which further includes forming a silicon oxide dielectric layer over said second silicon nitride layer, said silicon oxide dielectric layer having a thickness in a range between 5 and 10 Å, and said silicon oxide dielectric layer formed by a wet oxidation with a temperature in a range between 800° and 900° C.

17. The method of claim 12 wherein said insulating layer is formed by a CVD process using tetraethylorthosilicate (TEOS).

18. The method of claim 12 wherein said bottom electrode has a thickness in a range of between about 2000 and 5000 Å and an impurity concentration in a range of between about 1E19 and 1E20 atoms/cm$^3$.

19. The method of claim 12 wherein said first silicon nitride layer is formed using a LPCVD process with dichlorosilane and ammonia at reduced pressure at reduced pressure, said first silicon nitride layer formed at a pressure in a range between about 30 and 80 Pa, and at a temperature in a range between about 600° and 800° C., and said first silicon nitride layer having a thickness in a range between about 15 and 30 Å.

20. The method of claim 12 wherein said second silicon nitride layer is formed using a LPCVD process with dichlorosilane and ammonia at reduced pressure, said first silicon nitride layer formed at a pressure in a range between about 30 and 80 Pa, and at a temperature in a range between about 600° and 800° C. and said second silicon nitride layer having a thickness in a range between about 30 and 40 Å.

\* \* \* \* \*